United States Patent
Forbes et al.

(10) Patent No.: US 6,465,298 B2
(45) Date of Patent: *Oct. 15, 2002

(54) METHOD OF FABRICATING A SEMICONDUCTOR-ON-INSULATOR MEMORY CELL WITH BURIED WORD AND BODY LINES

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/510,095

(22) Filed: Feb. 22, 2000

(65) Prior Publication Data

US 2001/0053577 A1 Dec. 20, 2001

Related U.S. Application Data

(62) Division of application No. 08/889,395, filed on Jul. 8, 1997, now Pat. No. 6,191,470.

(51) Int. Cl.[7] ............................................. H01L 21/8242
(52) U.S. Cl. ..................... 438/242; 438/268; 438/270; 438/156
(58) Field of Search ................................ 438/243, 151, 438/156, 244, 268, 270, 242

(56) References Cited

U.S. PATENT DOCUMENTS

| | | | |
|---|---|---|---|
| 3,657,575 A | 4/1972 | Taniguchi et al. | 307/304 |
| 3,806,741 A | 4/1974 | Smith | 307/304 |
| 4,051,354 A | 9/1977 | Choate | 235/312 |
| 4,604,162 A | 8/1986 | Sobczak | 156/657 |
| 4,663,831 A | 5/1987 | Birrittella et al. | 29/576 E |
| 4,673,962 A | 6/1987 | Chatterjee et al. | 357/23.6 |
| 4,716,314 A | 12/1987 | Mulder et al. | 307/477 |
| 4,740,826 A | 4/1988 | Chatterjee | 357/42 |
| 4,761,385 A | 8/1988 | Pfiester, Jr. | 437/52 |
| 4,761,768 A | 8/1988 | Turner et al. | 365/201 |
| 4,766,569 A | 8/1988 | Turner et al. | 365/185 |
| 4,845,537 A | 7/1989 | Nishimura et al. | 357/23.4 |
| 4,920,065 A | 4/1990 | Chin et al. | 437/52 |
| 4,958,318 A | 9/1990 | Harari et al. | 365/149 |
| 4,965,651 A | 10/1990 | Wagner | 357/42 |
| 4,987,089 A | 1/1991 | Roberts | 437/34 |
| 5,001,526 A | 3/1991 | Gotou | 357/23.6 |

(List continued on next page.)

FOREIGN PATENT DOCUMENTS

JP 363066963 A 3/1988

OTHER PUBLICATIONS

Adler, E., et al., "The Evolution of IBM CMOS DRAM Technology", 167–188, (Jan./Mar., 1995).

(List continued on next page.)

*Primary Examiner*—Tuan H. Nguyen
(74) *Attorney, Agent, or Firm*—Schwegman, Lundberg, Woessner & Kluth, P.A.

(57) ABSTRACT

A memory cell array for a dynamic random access memory (DRAM) includes word and body lines that are buried below the active semiconductor surface in dielectric material in alternating parallel isolation trenches between adjacent ones of the memory cells. Semiconductor-on-insulator (SOI) processing techniques form the access transistor of each memory cell on a silicon island defined by the trenches and isolated from the substrate by an insulating layer. The word and body lines are oriented in the trenches to have a line width that is less than a minimum lithographic feature size F. The memory cells, including portions of the word and body lines, have a surface area of about 8 $F^2$. Also disclosed is a process for fabricating the DRAM cell using SOI processing techniques.

35 Claims, 10 Drawing Sheets

U.S. PATENT DOCUMENTS

| | | | |
|---|---|---|---|
| 5,006,909 A | 4/1991 | Kosa | 357/23.6 |
| 5,017,504 A | 5/1991 | Nishimura et al. | 437/40 |
| 5,021,355 A | 6/1991 | Dhong et al. | 437/35 |
| 5,028,977 A | 7/1991 | Keneth et al. | 357/43 |
| 5,057,896 A | 10/1991 | Gotou | 357/49 |
| 5,072,269 A | 12/1991 | Hieda | 357/23.6 |
| 5,102,817 A | 4/1992 | Chatterjee et al. | 437/47 |
| 5,110,752 A | 5/1992 | Lu | 437/47 |
| 5,128,831 A | 7/1992 | Fox, III et al. | |
| 5,140,388 A | 8/1992 | Bartelink | 357/23.4 |
| 5,156,987 A | 10/1992 | Sandhu et al. | 437/40 |
| 5,177,028 A | 1/1993 | Manning | 437/41 |
| 5,177,576 A | 1/1993 | Kimura et al. | 257/71 |
| 5,202,278 A | 4/1993 | Mathews et al. | 437/47 |
| 5,208,657 A | 5/1993 | Chatterjee et al. | 257/302 |
| 5,216,266 A | 6/1993 | Ozaki | 257/302 |
| 5,223,081 A | 6/1993 | Doan | 156/628 |
| 5,266,514 A | 11/1993 | Tuan et al. | 437/52 |
| 5,292,676 A | 3/1994 | Manning | 437/46 |
| 5,316,962 A | 5/1994 | Matsuo et al. | 437/52 |
| 5,320,880 A | 6/1994 | Sandhu et al. | 427/578 |
| 5,327,380 A | 7/1994 | Kersh, III et al. | 365/195 |
| 5,376,575 A | 12/1994 | Kim et al. | 437/52 |
| 5,385,854 A | 1/1995 | Batra et al. | 437/41 |
| 5,391,911 A | 2/1995 | Beyer et al. | 257/522 |
| 5,392,245 A | 2/1995 | Manning | 365/200 |
| 5,393,704 A | 2/1995 | Huang et al. | 437/203 |
| 5,396,093 A | 3/1995 | Lu | 257/306 |
| 5,396,452 A | 3/1995 | Wahlstrom | 365/149 |
| 5,409,563 A | 4/1995 | Cathey | 156/643 |
| 5,410,169 A | 4/1995 | Yamamoto et al. | 257/301 |
| 5,414,287 A | 5/1995 | Hong | 257/316 |
| 5,416,350 A | 5/1995 | Watanabe | 257/330 |
| 5,422,499 A | 6/1995 | Manning | 257/67 |
| 5,427,972 A | 6/1995 | Shimizu et al. | 437/52 |
| 5,432,739 A | 7/1995 | Pein | 365/185 |
| 5,438,009 A | 8/1995 | Yang et al. | 437/52 |
| 5,440,158 A | 8/1995 | Sung-Mu | 257/314 |
| 5,443,992 A | 8/1995 | Risch et al. | |
| 5,445,986 A | 8/1995 | Hirota | 437/60 |
| 5,451,538 A | 9/1995 | Fitch et al. | |
| 5,451,889 A | 9/1995 | Heim et al. | 326/81 |
| 5,460,316 A | 10/1995 | Hefele | 228/39 |
| 5,460,988 A | 10/1995 | Hong | 437/43 |
| 5,466,625 A | 11/1995 | Hsieh et al. | 437/52 |
| 5,483,094 A | 1/1996 | Sharma et al. | 257/316 |
| 5,483,487 A | 1/1996 | Sung | 365/185.33 |
| 5,492,853 A | 2/1996 | Jeng et al. | 437/60 |
| 5,495,441 A | 2/1996 | Hong | 365/185.01 |
| 5,497,017 A | 3/1996 | Gonzales | 257/306 |
| 5,502,629 A | 3/1996 | Ito et al. | 363/60 |
| 5,504,357 A | 4/1996 | Kim et al. | 257/306 |
| 5,508,219 A | 4/1996 | Bronner et al. | 437/52 |
| 5,508,542 A | 4/1996 | Geiss et al. | 257/301 |
| 5,519,236 A | 5/1996 | Ozaki et al. | 257/302 |
| 5,528,062 A | 6/1996 | Hsieh et al. | 257/298 |
| 5,528,173 A | 6/1996 | Merrit et al. | 326/80 |
| 5,563,083 A | 10/1996 | Pein | 437/43 |
| 5,574,299 A | 11/1996 | Kim | 257/596 |
| 5,593,912 A | 1/1997 | Rajeevakumar | 437/52 |
| 5,616,934 A | 4/1997 | Dennison et al. | 257/67 |
| 5,637,898 A | 6/1997 | Baliga | 257/330 |
| 5,640,342 A | 6/1997 | Gonzalez | 365/156 |
| 5,641,545 A | 6/1997 | Sandhu | 427/573 |
| 5,644,540 A | 7/1997 | Manning | 365/200 |
| 5,646,900 A | 7/1997 | Tsukude et al. | 365/205 |
| 5,691,230 A | 11/1997 | Forbes | 437/62 |
| 5,696,011 A | 12/1997 | Yamazaki et al. | |
| 5,705,415 A | 1/1998 | Orlowski et al. | 437/43 |
| 5,707,885 A | 1/1998 | Lim | |
| 5,789,967 A | 8/1998 | Katoh | 327/408 |
| 5,821,796 A | 10/1998 | Yaklin et al. | 327/313 |
| 5,852,375 A | 12/1998 | Byrne et al. | 327/108 |
| 5,879,971 A | 3/1999 | Witek | 438/238 |
| 5,909,618 A * | 6/1999 | Forbes et al. | 438/242 |
| 5,920,088 A | 7/1999 | Augusto | 257/192 |
| 5,991,225 A | 11/1999 | Forbes et al. | 365/230.06 |
| 6,025,225 A | 2/2000 | Forbes et al. | 438/243 |
| 6,043,527 A | 3/2000 | Forbes | 257/296 |
| 6,066,869 A | 5/2000 | Noble et al. | 257/296 |
| 6,100,123 A | 8/2000 | Bracchitta et al. | 438/199 |
| 6,208,164 B1 | 3/2001 | Noble et al. | 326/41 |

OTHER PUBLICATIONS

Asai, S., et al., "Technology Challenges for Integration Near and Below 0.1 micrometer", *Proceedings of the IEEE*, 85, Special Issue on Nanometer–Scale Science & Technology, 505–520, (Apr. 1997).

Askin, H.O., et al., "Fet Device Parameters Compensation Circuit", *IBM Technical Disclosure Bulletin*, 14, 2088–2089, (Dec. 1971).

Banerjee, S.K., et al., "Characterization of Trench Transistors for 3–D Memories", *1986 Symposium on VLSI Technology, Digest of Technical Papers*, San Diego, CA, 79–80, (May 28–30, 1986).

Blalock, T.N., et al., "A High–Speed Sensing Scheme for 1T Dynamic RAM's Utilizing the Clamped Bit–Line Sense Amplifier", *IEEE Journal of Solid–State Circuits*, 27(4), pp. 618–624, (Apr. 1992).

Bomchil, G., et al., "Porous Silicon: The Material and its Applications in Silicon–On–Insulator Technologies", *Applied Surface Science*, 41/42, 604–613, (1989).

Burnett, D., et al., "Implications of Fundamental Threshold Voltage Variations for High–Density SRAM and Logic Circuits", *1994 Symposium on VLSI Technology, Digest of Technical Papers*, Honolulu, HI, 15–16, (Jun. 4–7, 1994).

Burnett, D., et al., "Statistical Threshold–Voltage Variation and its Impact on Supply–Voltage Scaling", *Proceedings SPIE: Microelectronic Device and Multilevel Interconnection Technology*, 2636, 83–90, (1995).

Chen, M., et al., "Back–Gate Forward Bias Method for Low Voltage CMOS Digital Circuits", *IEEE Transactions on Electron Devices*, 43, 904–909, (1996).

Chen, M.J., et al., "Back–Gate Forward Bias Method for Low–Voltage CMOS Digital Circuits", *IEEE Transactions on Electron Devices*, 43, 904–909, (Jun. 1986).

Chen, M.J., et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Applications", *Proceedings of the 1996 IEEE International SOI Conference*, Sanibel Island, FL, 20–21, (Sep. 30–Oct. 3, 1996).

Clemen, R., et al., "VT–compensated TTL–Compatible Mos Amplifier", *IBM Technical Disclosure Bulletin*, 21, 2874–2875, (1978).

De, V.K., et al., "Random MOSFET Parameter Fluctuation Limits to Gigascale Integration (GSI)", *1996 Symposium on VLSI Technology, Digest of Technical Papers*, Honolulu, HI, 198–199, (Jun. 11–13, 1996).

De, V.K., et al., "Random Mosfet Parameter Fluctuation Limits to Gigascale Integration (GST)", *Symposium on VLSI Technology Digest of Technical Papers*, 198–199, (1996).

DeBar, D.E., "Dynamic Substrate Bias to Achieve Radiation Hardening", *IBM Technical Disclosure Bulletin*, 25, 5829–5830, (1983).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17(11), 509–511, (Nov. 1996).

Fong, Y., et al., "Oxides Grown on Textured Single–Crystal Silicon—Dependence on Process and Application in EEPROMs", *IEEE Transactions on Electron Devices*, 37(3), pp. 583–590, (Mar. 1990).

Forbes, L., "Automatic On–clip Threshold Voltage Compensation", *IBM Technical Disclosure Bulletin*, 14, 2894–2895, (1972).

Forbes, L., et al. "Resonant Forward–Biased Guard–Ring Diodes for Suppression of Substrate Noise in Mixed–Mode CMOS Circuits", *Electronics Letters*, 31, 720–721, (Apr. 1995).

Foster, R., et al., "High Rate Low–Temperature Selective Tungsten", In: *Tungsten and Other Refractory Metals for VLSI Applications III*, V.A. Wells, ed., Materials Res. Soc., Pittsburgh, PA, 69–72, (1988).

Frantz, H., et al., "Mosfet Substrate Bias–Voltage Generator", *IBM Technical Disclosure Bulletin*, 11, 1219–1220, (Mar. 1969).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Gong, S., et al., "Techniques for Reducing Switching Noise in High Speed Digital Systems", *Proceedings of the 8th Annual IEEE International ASIC Conference and Exhibit*, 21–24, (1995).

Hao, M.Y., et al., "Electrical Characteristics of Oxynitrides Grown on Textured Single–Crystal Silicon", *Appl. Phys. Lett.*, 60, 445–447, (Jan. 1992).

Harada, M., et al., "Suppression of Threshold Voltage Variation in MTCMOS/SIMOX Circuit Operating Below 0.5 V", *1996 Symposium on VLSI Technology, Digest of Technical Papers*, Honolulu, HI, 96–97, (Jun. 11–13, 1996).

Heavens, O., *Optical Properties of Thin Solid Films*, Dover Pubs. Inc., New York, 167, (1965).

Hisamoto, D., et al., "A New Stacked Cell Structure for Giga–Bit DRAMs using Vertical Ultra–Thin SOI (DELTA) MOSFETs", *1991 IEEE International Electron Devices Meeting, Technical Digest*, Washington, D.C., 959–961, (Dec. 8–11, 1991).

Hodges, D.A., et al., "MOS Decoders", In: *Analysis and Design of Digital Integrated Circuits*, 2nd Edition, Section: 9.1.3, 354–357, (1988).

Holman, W.T., et al., "A Compact Low Noise Operational Amplifier for a 1.2 Micrometer Digital CMOS Technology", *IEEE Journal of Solid–State Circuits*, 30, 710–714, (Jun. 1995).

Horie, H., et al., "Novel High Aspect Ratio Aluminum Plug for Logic/DRAM LSI's Using Polysilicon–Aluminum Substitute", *Technical Digest: IEEE International Electron Devices Meeting*, San Francisco, CA, 946–948, (1996).

Hu, G., et al., "Will Flash Memory Replace Hard Disk Drive?", *1994 IEEE International Electron Device Meeting*, Panel Discussion, Session 24, Outline, 1 p., (Dec. 13, 1994).

Huang, W.L., et al., "TFSOI Complementary BiCMOS Technology for Low Power Applications", *IEEE Transactions on Electron Devices*, 42, 506–512, (Mar. 1995).

Jun, Y.K., et al., "The Fabrication and Electrical Properties of Modulated Stacked Capacitor for Advanced DRAM Applications", *IEEE Electron Device Letters*, 13, 430–432, (Aug. 1992).

Jung, T.S., et al., "A 117–mm2 3.3–V Only 128–Mb Multilevel NAND Flash Memory for Mass Storage Applications", *IEEE Journal of Solid–State Circuits*, 31, 1575–1582, (Nov. 1996).

Kang, H.K., et al., "Highly Manufacturable Process Technology for Reliable 256 Mbit and 1Gbit DRAMs", *IEEE International Electron Devices Meeting, Technical Digest*, San Francisco, CA, 635–638, (Dec. 11–14, 1994).

Kim, Y.S., et al., "A Study on Pyrolysis DMEAA for Selective Deposition of Aluminum", In: *Advanced Metallization and Interconnect Systems for ULSI Applications in 1995*, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics*, 34, 6899–6902, (Dec. 1995).

Klaus, et al., "Atomic Layer Controlled Growth of SiO2 Films Using Binary Reaction Sequence Chemistry", *Applied Physics Lett.* 70(9), 1092–94, (Mar. 3, 1997).

Kohyama, Y., et al., "Buried Bit–Line Cell for 64MB DRAMs", *1990 Symposium on VLSI Technology, Digest of Technical Papers*, Honolulu, HI, 17–18, (Jun. 4–7, 1990).

Koshida, N., et al., "Efficient Visible Photoluminescence from Porous Silicon", *Japanese Journal of Applied Physics*, 30, L1221–L1223, (Jul. 1991).

Kuge, S., et al., "SOI–DRAM Circuit Technologies for Low Power High Speed Multigiga Scale Memories", *IEEE Journal of Solid–State Circuits*, 31(4), pp. 586–591, (Apr. 1996).

Lantz, II, L., "Soft Errors Induced By Alpha Particles", *IEEE Transactions on Reliability*, 45, 174–179, (Jun. 1996).

Lehmann, et al., "A Novel Capacitor Technology Based on Porous Silicon", *Thin Solid Films 276*, Elsevier Science, 138–42, (1996).

Lehmann, V., "The Physics of Macropore Formation in Low Doped n–Type Silicon", *Journal of the Electrochemical Society*, 140(10), 2836–2843, (Oct. 1993).

Lu, N., et al., "The SPT Cell—A New Substrate–Plate Trench Cell for DRAMs", *1985 IEEE International Electron Devices Meeting, Technical Digest*, Washington, D.C., 771–772, (Dec. 1–4, 1985).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Maeda, S., et al., "A Vertical Phi–Shape Transistor (VPhiT) Cell for 1 Gbit DRAM and Beyond", *1994 Symposium of VLSI Technology, Digest of Technical Papers*, Honolulu, HI, 133–134, (Jun. 7–9, 1994).

Maeda, S., et al., "Impact of a Vertical Phi–Shape Transistor (VPhiT) Cell for 1 Gbit DRAM and Beyond", *IEEE Transactions on Electron Devices*, 42, 2117–2123, (Dec. 1995).

Malaviya, S., *IBM TBD*, 15, p. 42, (Jul. 1972).

Masu, K., et al., "Multilevel Metallization Based on Al CVD", *1996 IEEE Symposium on VLSI Technology, Digest of Technical Papers*, Honolulu, HI, 44–45, (Jun. 11–13, 1996).

McCredie, B.D., et al., "Modeling, Measurement, and Simulation of Simultaneous Switching Noise", *IEEE Transactions on Components, Packaging, and Manufacturing Technology*—Part B, 19, 461–472, (Aug. 1996).

Muller, K., et al., "Trench Storage Node Technology for Gigabit DRAM Generations", *Digest IEEE International Electron Devices Meeting*, San Francisco, CA, 507–510, (Dec. 1996).

Nitayama, A., et al., "High Speed and Compact CMOS Circuits with Multipillar Surrounding Gate Transistors", *IEEE Transactions on Electron Devices*, 36, 2605–2606, (Nov. 1989).

Ohba, T., et al., "Evaluation on Selective Deposition of CVD W Films by Measurement of Surface Temperature", In: *Tungsten and Other Refractory Metals for VLSI Applications II*, Materials Research Society, Pittsburgh, PA, 59–66, (1987).

Ohba, T., et al., "Selective Chemical Vapor Deposition of Tungsten Using Silane and Polysilane Reductions", In: *Tungsten and Other Refractory Metals for VLSI Applications IV*, Materials Research Society, Pittsburgh, PA, 17–25, (1989).

Ohno, Y., et al., "Estimation of the Charge Collection for the Soft–Error Immunity by the 3D–Device Simulation and the Quantitative Investigation", *Simulation of Semiconductor Devices and Processes*, 6, 302–305, (Sep. 1995).

Oowaki, Y., et al., "New alpha–Particle Induced Soft Error Mechanism in a Three Dimensional Capacitor Cell", *IEICE Transactions on Electronics*, 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics*, 76–C, 1604–1610, (Nov. 1993).

Ott, A.W., et al., "A1303 Thin Film Growth on Si(100) Using Binary Reaction Sequence Chemistry", *Thin Solid Films*, vol. 292, 135–44, (1997).

Ozaki, T., et al., "A Surrounding Isolation–Merged Plate Electrode (SIMPLE) Cell with Checkered Layout for 256Mbit DRAMs and Beyond", *1991 IEEE International Electron Devices Meeting*, Washington, D.C., 469–472, (Dec. 8–11, 1991).

Parke, S.A., et al., "A High–Performance Lateral Bipolar Transistor Fabricated on SIMOX", *IEEE Electron Device Letters*, 14, 33–35, (Jan. 1993).

Pein, H., et al., "A 3–D Sidewall Flash EPROM Cell and Memory Array", *IEEE Transactions on Electron Devices*, 40, 2126–2127, (Nov. 1993).

Pein, H., et al., "Performance of the 3–D Pencil Flash EPROM Cell and Memory Array", *IEEE Transactions on Electron Devices*, 42, 1982–1991, (Nov., 1995).

Pein, H.B., et al., "Performance of the 3–D Sidewall Flash EPROM Cell", *IEEE International Electron Devices Meeting, Technical Digest*, 11–14, (1993).

Puri, Y., "Substrate Voltage Bounce in NMOS Self–biased Substrates", *IEEE Journal of Solid–State Circuits*, SC–13, 515–519, (Aug. 1978).

Ramo, S., et al., *Fields and Waves in Communication Electronics*, Third Edition, John Wiley & Sons, Inc., pp. 428–433, (1994).

Rao, K.V., et al., "Trench Capacitor Design Issues in VLSI DRAM Cells", *1986 IEEE International Electron Devices Meeting, Technical Digest*, Los Angeles, CA, 140–143, (Dec. 7–10, 1986).

Richardson, W.F., et al., "A Trench Transistor Cross–Point DRAM Cell", *IEEE International Electron Devices Meeting*, Washington, D.C., 714–717, (Dec. 1–4, 1985).

Sagara, K., et al., "A 0.72 micro–meter2 Recessed STC (RSTC) Technology for 256Mbit DRAMs using Quarter-–Micron Phase–Shift Lithography", *1992 Symposium on VLSI Technology, Digest of Technical Papers*, Seattle, WA, 10–11, (Jun. 2–4, 1992).

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Seevinck, E., et al., "Current–Mode Techniques for High-–Speed VLSI Circuits with Application to Current Sense Amplifier for CMOS SRAM's", *IEEE Journal of Solid State Circuits*, 26(4), pp. 525–536, (Apr. 1991).

Senthinathan, R., et al., "Reference Plane Parasitics Modeling and Their Contribution to the Power and Ground Path "Effective" Inductance as Seen by the Output Drivers", *IEEE Transactions on Microwave Theory and Techniques*, 42, 1765–1773, (Sep. 1994).

Shah, A.H., et al., "A 4–Mbit DRAM with Trench–Transistor Cell", *IEEE Journal of Solid–State Circuits*, SC–21, 618–625, (Oct. 1986).

Shah, A.H., et al., "A 4Mb DRAM with Cross–Point Trench Transistor Cell", *1986 IEEE International Solid–State Circuits Conference, Digest of Technical Papers*, 268–269, (Feb. 21, 1986).

Sherony, M.J., et al., "Reduction of Threshold Voltage Sensitivity in SOI MOSFET's", *IEEE Electron Device Letters*, 16, 100–102, (Mar. 1995).

Shimomura, K., et al., "A 1V 46ns 16Mb SOI–DRAM with Body Control Technique", *1997 IEEE International Solid-State Circuits Conference, Digest of Technical Papers*, 68–69, (Feb. 6, 1997).

Stanisic, B.R., et al., "Addressing Noise Decoupling in Mixed–Signal IC's: Power Distribution Design and Cell Customization", *IEEE Journal of Solid–State Circuits*, 30, 321–326, (Mar. 1995).

Stellwag, T.B., et al., "A Vertically–Integrated GaAs Bipolar DRAM Cell", *IEEE Transactions on Electron Devices*, 38, 2704–2705, (Dec. 1991).

Su, D.K., et al., "Experimental Results and Modeling Techniques for Substrate Noise in Mixed–Signal Integrated Circuits", *IEEE Journal of Solid–State Circuits*, 28(4), 420–430, (Apr. 1993).

Suma, K., et al., "An SOI–DRAM with Wide Operating Voltage Range by CMOS/SIMOX Technology", *IEEE Journal of Solid–State Circuits*, 29(11), pp. 1323–1329, (Nov. 1994).

Sunouchi, K., et al., "A Surrounding Gate Transistor (SGT) Cell for 64/256Mbit DRAMs", *1989 IEEE International Electron Devices Meeting, Technical Digest*, Washington, D.C., 23–26, (Dec. 3–6, 1989).

Sunouchi, K., et al., "Process Integration for 64M DRAM Using an Asymmetrical Stacked Trench Capacitor (AST) Cell", *1990 IEEE International Electron Devices Meeting*, San Francisco, CA, 647–650, (Dec. 9–12, 1990).

Suntola, T., "Atomic Layer Epitaxy", *Handbook of Crystal Growth 3, Thin Films of Epitaxy*, Part B: Growth Mechanics and Dynamics, Elsevier, Amsterdam, 601–63, (1994).

Sze, S.M., *VLSI Technology*, 2nd Edition, Mc Graw–Hill, NY, 90, (1988).

Takai, M., et al., "Direct Measurement and Improvement of Local Soft Error Susceptibility in Dynamic Random Access Memories", *Nuclear Instruments & Methods in Physics Research,* B–99, Proceedings of the 13th International Conference on the Application of Accelerators in Research and Industry, Denton, TX, 562–565, (Nov. 7–10, 1994).

Takato, H., et al., "High Performance CMOS Surrounding Gate Transistor (SGT) for Ultra High Density LSIs", *IEEE International Electron Devices Meeting, Technical Digest,* 222–225, (1988).

Takato, H., et al., "Impact of Surrounding Gate Transistor (SGT) for Ultra–High Density LSI's", *IEEE Transactions on Electron Devices,* 38, 573–578, (Mar. 1991).

Tanabe, N., et al., "A Ferroelectric Capacitor Over Bit–Line (F–COB) Cell for High Density Nonvolatile Ferroelectric Memories", *1995 Symposium on VLSI Technology, Digest of Technical Papers,* Kyoto, Japan, 123–124, (Jun. 6–8, 1995).

Temmler, D., "Multilayer Vertical Stacked Capacitors (MVSTC) for 64Mbit and 256Mbit DRAMs", *1991 Symposium on VLSI Technology, Digest of Technical Papers,* Oiso, 13–14, (May 28–30, 1991).

Terauchi, M., et al., "A Surrounding Gate Transistor (SGT) Gain Cell for Ultra High Density DRAMs", *1993 Symposium on VLSI Technology, Digest of Technical Papers,* Kyoto, Japan, 21–22, (1993).

Tsui, P.G., et al., "A Versatile Half–Micron Complementary BiCMOS Technology for Microprocessor–Based Smart Power Applications", *IEEE Transactions on Electron Devices,* 42, 564–570, (Mar. 1995).

Verdonckt–Vandebroek, S., et al., "High–Gain Lateral Bipolar Action in a MOSFET Structure", *IEEE Transactions on Electron Devices 38,* 2487–2496, (Nov. 1991).

Vittal, A., et al., "Clock Skew Optimization for Ground Bounce Control", *1996 IEEE/ACM International Conference on Computer–Aided Design, Digest of Technical Papers,* San Jose, CA, 395–399, (Nov. 10–14, 1996).

Wang, N., *Digital MOS Integrated Circuits,* Prentice Hall, Inc. , Englewood Cliffs, NJ, p. 328–333, (1989).

Wang, P.W., et al., "Excellent Emission Characteristics of Tunneling Oxides Formed Using Ultrathin Silicon Films for Flash Memory Devices", *Japanese Journal of Applied Physics,* 35, 3369–3373, (Jun. 1996).

Watanabe, H., et al., "A New Cylindrical Capacitor Using Hemispherical Grained Si (HSG–Si) for 256Mb DRAMs", *IEEE International Electron Devices Meeting, Technical Digest,* San Francisco, CA, 259–262, (Dec. 13–16, 1992).

Watanabe, H., et al., "A Novel Stacked Capacitor with Porous–Si Electrodes for High Density DRAMs", *1993 Symposium on VLSI Technology, Digest of Technical Papers,* Kyoto, Japan, 17–18, (1993).

Watanabe, H., et al., "An Advanced Fabrication Technology of Hemispherical Grained (HSG) Poly–Si for High Capacitance Storage Electrodes", *Extended Abstracts of the 1991 International Conference on Solid State Devices and Materials,* Yokohama, Japan, 478–480, (1991).

Watanabe, H., et al., "Device Application and Structure Observation for Hemispherical–Grained Si", *J. Appl. Phys.,* 71, 3538–3543, (Apr. 1992).

Watanabe, H., et al., "Hemispherical Grained Silicon (HSG–Si) Formation on In–Situ Phosphorous Doped Amorphous–Si Using the Seeding Method", *Extended Abstracts of the 1992 International Conference on Solid State Devices and Materials,* Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits,* 30, 960–971, (Sep. 1995).

Wooley, et al., "Experimental Results and Modeling Techniques for Substrate Noise in Mixed Signal Integrated Circuits", *IEEE Journal of Solid State Circuits,* vol. SC–28, 420–30, (1993).

Yamada, T., et al., "A New Cell Structure with a Spread Source/Drain (SSD) MOSFET and a Cylindrical Capacitor for 64–Mb DRAM's", *IEEE Transactions on Electron Devices,* 38, 2481–2486, (Nov. 1991).

Yamada, T., et al., "Spread Source/Drain (SSD) MOSFET Using Selective Silicon Growth for 64Mbit DRAMs", *1989 IEEE International Electron Devices Meeting, Technical Digest,* Washington, D.C., 35–38, (Dec. 3–6, 1989).

Yoshikawa, K., "Impact of Cell Threshold Voltage Distribution in the Array of Flash Memories on Scaled and Multilevel Flash Cell Design", *1996 Symposium on VLSI Technology, Digest of Technical Papers,* Honolulu, HI, 240–241, (Jun. 11–13, 1996).

\* cited by examiner

METHOD OF FABRICATING A SEMICONDUCTOR-ON-INSULATOR MEMORY CELL WITH BURIED WORD AND BODY LINES

This application is a divisional of U.S. Ser. No. 08/889,395 filed Jul. 8, 1997 now U.S. Pat. No. 6,191,470.

FIELD OF THE INVENTION

The present invention relates generally to semiconductor memory devices, and particularly to a dynamic random access memory (DAM) having a memory cell with buried word and body lines.

BACKGROUND OF THE INVENTION

Dynamic random access memories (DRAMs) typically include an array of tacked or deep trench capacitors for storing data as charge. Memory cell access field-effect transistors (FETs) are provided for switchably accessing the charge storage nodes of these storage capacitors. DRAMS that are fabricated on bulk silicon substrates are susceptible to "soft errors" resulting from alpha particles that stray from the environment or integrated circuit package. Such alpha particles penetrate the bulk silicon substrate, where they generate large numbers of minority charge carriers. These minority charge carriers are collected at reverse-biased pn–junctions of the access FETs, where they perturb the data that is stored as charge on the storage capacitors. For immunity to such soft errors, large trench or stacked storage capacitors are required in bulk silicon DRAMs in order to store large quantities of charge. These capacitors constitute an estimated 30% of DRAM fabrication cost.

By contrast, DRAMs that are fabricated using semiconductor-on-insulator (SOI) substrates are more immune to soft errors. SOI substrates typically comprise a thin layer of active semiconductor, such as silicon, on an underlying insulating layer, such as silicon dioxide ($SiO_2$). Memory cells are fabricated upon the thin active semiconductor layer. The number of minority charge carriers generated by a penetrating alpha particle decreases along with the available semiconductor volume. Since SOI substrates present less available semiconductor volume than bulk silicon substrates, fewer minority carriers are generated in the thin active semiconductor layer. As a result, SOI DRAMs are less prone to disturbance of data charges resulting from alpha particles. Thus, storage capacitors in an SOI DRAM can be an estimated one-tenth the size of storage capacitors in a bulk silicon DRAM. The difference may become even greater as technology advances and dimensions become smaller. Bulk silicon DRAMs will require comparatively larger-valued storage capacitances. Such larger storage capacitances will likely occupy more integrated circuit area or require a high dielectric constant insulating material, thereby increasing fabrication cost and complexity. SOI DRAMs, having smaller-valued storage capacitances, will be cheaper than bulk silicon DRAMs.

A further consideration is a body bias voltage that is provided to the body portion of the memory cell access FET to improve memory cell operation. The body bias voltage allows the memory cell to operate from a low power supply voltage, such as 1.5 volts, from which a gate voltage controlling the access FET is derived. Turning the access FET on to transfer data to or from the storage capacitor requires a gate voltage in excess of a turn-on threshold voltage. However, low power supply voltages, such as 1.5 volts, may not provide sufficient overdrive voltage in excess of the threshold voltage to fully turn on the access FET. The gate voltage required for turning on the access FET can be reduced by controlling the body bias voltage. The body bias voltage also controls a subthreshold leakage current of the access FET. The access FET is turned off when data is stored as charge on the storage capacitor. During the time period when the access FET is turned off, the subthreshold leakage current removes some of the stored data charges from the storage node of the storage capacitor. The body bias voltage value controls the reverse bias of the access FET pn junction that is coupled to the storage node.

By increasing the reverse bias of such pn junctions, the subthreshold leakage current is reduced. Without a proper body bias voltage, the subthreshold leakage current would lead to short data retention times.

Providing the body bias voltage to the memory cell access FETs requires a conductive body line that interconnects the access FET body contacts to receive the body bias voltage. The body line, as well as bit line, word line, and other such conductors all occupy integrated circuit surface area. To increase DRAM data storage density, the surface area of each memory cell, referred to as its "footprint", must be minimized. However, conventional memory cells typically require word lines and body lines on the upper surface of the memory cell, requiring surface area in addition to that of the memory cell storage capacitor.

For the reasons stated above, and for other reasons stated below which will become apparent to those skilled in the art upon reading and understanding the present specification, there is a need in the art for a DRAM or other semiconductor memory device having a memory cell providing an access FET word and body lines that occupy reduced integrated circuit area There is a further need in the art for a compact radiation tolerant memory cell that allows the use of smaller storage capacitors to increase memory data storage density and to reduce integrated circuit manufacturing costs.

SUMMARY OF THE INVENTION

The present invention provides a memory cell. A semiconductor island is formed on a substrate. An access transistor is formed in the island, including first and second source/drain regions, a gate region, and a body region. A conductive word line is formed substantially adjacent to the island and located at a height that is no higher than the island's upper surface. The word line is coupled to the gate region of the access transistor. A conductive body region is formed substantially adjacent to a side surface of the island and located at a height that is no higher than the island's upper surface. The body line is coupled to the body region of the access transistor. A conductive bit line is electrically coupled to the first source/drain region of the access transistor. A storage capacitor is coupled to the second source/drain region of the access transistor.

In another embodiment, the memory cell array comprises a plurality of memory cells. Each memory cell includes an access transistor having a gate region, body region, and first and second source/drain regions. Each memory cell further includes a storage capacitor coupled to the second source/drain region of the access transistor. A plurality of parallel isolation trenches includes first and second trenches alternatingly disposed between rows of the memory cells for providing isolation therebetween. A plurality of word lines is provided. Each word line is carried in one of the first trenches at a height that is no higher than the upper surface of the body region of the access transistor. Each word line is coupled to the gate region of access transistors in the row of the memory cells. A plurality of body lines is provided. Each body line is carried in one of the second trenches at a height that is no higher than the upper surface of the access transistor. Each body line is coupled to the body region of access transistors in at least one row of the memory cells. A plurality of bit lines is provided. Each bit line is coupled to the first source/drain region of ones of the access transistors.

In another embodiment, the semiconductor memory array includes a dielectric layer carried by a substrate. First and second semiconductor bars are formed on the dielectric layer. Each of the bars includes a plurality of active areas. An electrically isolating dielectric material is interposed between adjacent ones of the active areas. A plurality of access transistors is provided, including an access transistor formed in each of the active areas of the bars. A plurality of isolation trenches is provided, including a trench located between the first and second bars and extending approximately the length of the bar. A plurality of word lines is provided, including a word line located in the trench and extending approximately the length of the trench along a first side of the bars. A plurality of body lines is provided, including a body line extending approximately along a second side of the first and second bars. A plurality of bit lines is also provided.

Another embodiment of the present invention provides a semiconductor memory device, including a memory array. The memory array includes a plurality of bit lines, a plurality of word lines, and a plurality of memory cells. Each memory cell includes an access transistor having a gate region, a body region, and first and second source/drain regions. Each memory cell includes a storage capacitor that is electrically coupled to the second source/drain region of the access transistor. Access circuitry is provided for accessing the memory cells. A plurality of isolation trenches is provided, including a first trench between first and second access transistors and a second trench between the second and third access transistors. A first one of the word lines is located in the first trench at a height that is no higher than the upper surface of the access transistor. The first word line is electrically coupled to the gate regions of the first and second access transistors. A first one of the body lines is located in the second trench at a height that is no higher than the upper surface of the access transistor. The first body line is electrically coupled to the body portions of the second and third access transistors. A first one of the bit lines is coupled to the first source/drain region of each of the first, second and third access transistors.

Another embodiment of the invention includes a method of fabricating a memory array on a semiconductor substrate. First and second trenches are formed in the substrate to define a bar of the semiconductor material. An insulating layer is formed between the bar and the substrate for providing electrical isolation therebetween. A plurality of active areas of semiconductor material are defined on the bar. An access transistor is produced in each of the active areas. Each access transistor includes gate, body, and first and second source/drain regions. A word line is formed in the first trench. The word line is coupled to the gate region of at least one of the access transistors. A body line is formed in the second trench. The body line is electrically connected to the body portion of at least one of the access transistors.

Another embodiment of the invention provides a method for fabricating a memory array on a semiconductor substrate. A plurality of trenches is formed in the substrate to define at least first, second and third bars of the semiconductor material. An insulating layer is formed between the bars and the substrate for providing electrical isolation therebetween. A plurality of semiconductor active areas is defined on each of the bars. An access transistor is produced in each of the active areas. Each access transistor includes gate, body, and first and second source/drain regions. A word line is formed in a first one of the trenches. The word line is coupled to the gate region of a plurality of the access transistors on the first and second bars. A body line is formed in a second one of the trenches. The body line is electrically coupled to the body region of a plurality of the access transistors on the second and third bars.

Thus, the present invention provides a memory device and fabrication method that includes a memory cell having an access FET word lines and body lines that occupy reduced integrated circuit area. The invention also provides a compact radiation insensitive semiconductor-on-insulator memory cell, which uses a smaller storage capacitor, increases memory data storage density, and reduces integrated circuit manufacturing costs.

BRIEF DESCRIPTION OF THE DRAWINGS

In the drawings, like numerals describe substantially similar components throughout the several views.

DESCRIPTION OF THE INVENTION

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The following detailed description is not to be taken in a limiting sense, and the scope of the present invention is defined only by the appended claims.

Figure 1:
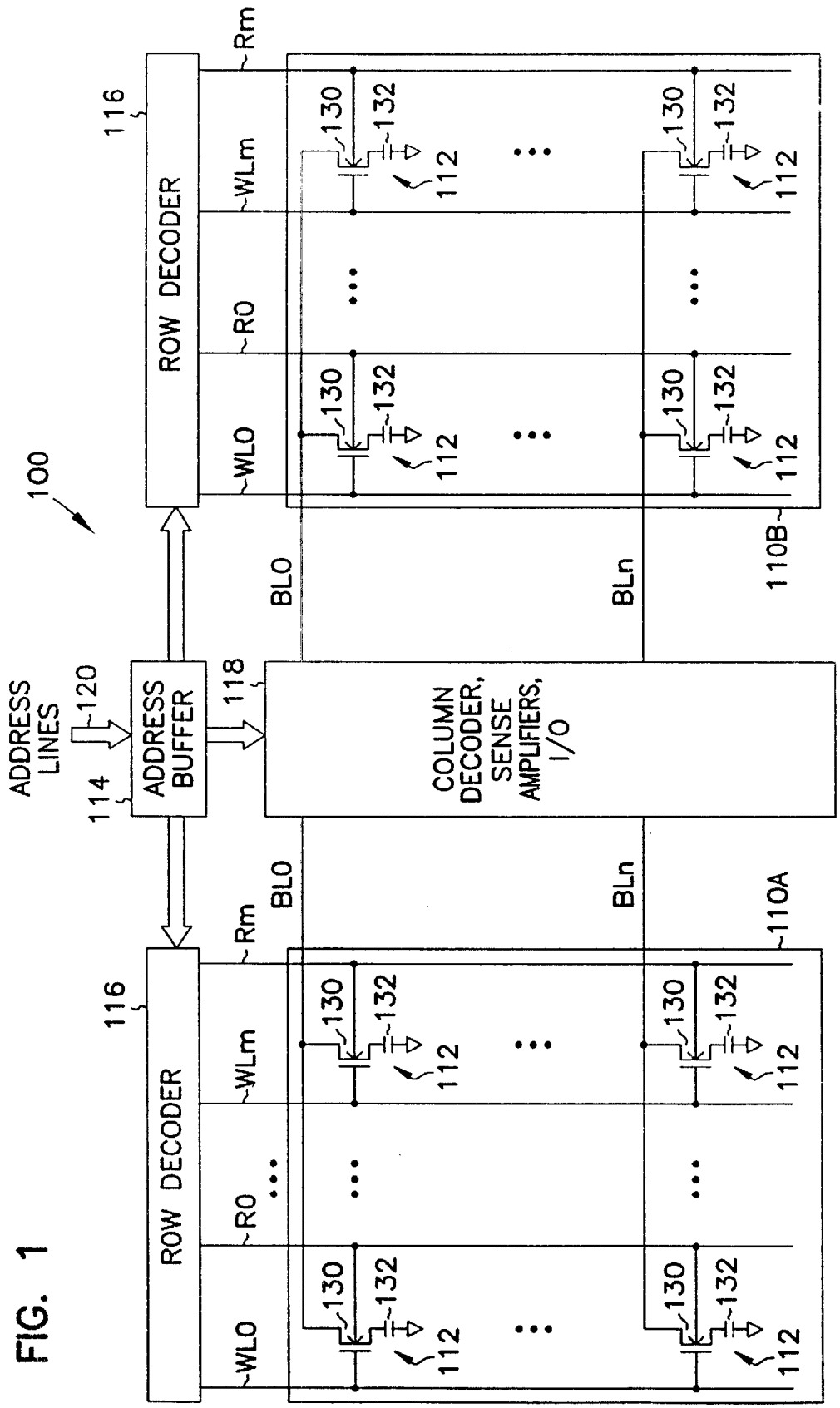
FIG. 1 is a schematic representation illustrating generally one embodiment of a semiconductor memory device according to the invention.

FIG. 1 is a schematic representation illustrating generally one embodiment of a semiconductor memory 100 device incorporating an array of memory cells provided by the invention. In FIG. 1, memory 100 illustrates, by way of example but not by way of limitation, a dynamic random access memory (DRAM), but the invention also includes any other semiconductor memory devices. Memory 100 includes memory cell arrays 110, such as 110A and 110B. Each array 110 includes M rows and N columns of memory cells 112.

In the exemplary embodiment of FIG. 1, each memory cell includes a transfer device, such as n-channel cell access field-effect transistor (FET) 130 or any other known or unknown transistor or switching device. Access FET 130 is coupled to a storage node of a storage capacitor 132. The other terminal of storage capacitor 132 is coupled to a reference voltage such as the ground voltage VSS. Each of the M rows includes one of word lines WL0, WL1 . . . WLm-1, WLm coupled to the input nodes of memory cells 112 at respective gate terminals of access FETs 130 or to the control terminal of an equivalent switching device. Each of the M rows also includes one of body lines R1, R2, . . . , Rm-1, Rm coupled to the body terminals of access FETs 130 in memory cells 112. Each of the N columns includes one of bit lines BL0, BL1 . . . BLn-1, BLn.

Bit lines BL0–BLn are used to write to and read data from memory cells 112. Word lines WL0–WLm are used to access a particular row of memory cells 112 that is to be written or read. Addressing circuitry is also included. For example, address buffer 114 controls column decoders 118, which also include sense amplifiers and input/output circuitry that is coupled to bit lines BL0–BLn. Address buffer 114 also controls row decoders 116. Row decoders 116 and column decoders 118 selectably access memory cells 112 in response to address signals that are provided on address lines 120 during write and read operations. The address signals are typically provided by an external controller such as a microprocessor or other memory controller. Each of memory cells 112 has a substantially identical structure, and accordingly, only one memory cell 112 structure is described herein.

In operation, memory 100 receives an address of a particular memory cell 112 at address buffer 114. Address buffer 114 identifies one of the word lines WL0–WLm of the particular memory cell 112 to row decoder 116. Row decoder 116 selectively activates the particular word line WL0-WLm to activate access FETs 130 of each memory cell 112 that is connected to the selected word line WL0–WLm. Column decoder 118 selects the one of bit lines BL0–BLn of the particularly addressed memory cell 112. For a write operation, data received by input/output circuitry is coupled to the one of bit lines BL0–BLn and through the access FET 130 to charge or discharge the storage capacitor 132 of the selected memory cell 112 to represent binary data. For a read operation, data stored in the selected memory cell 112, as represented by the charge on its storage capacitor 132, is coupled to the one of bit lines BL0–BLn, amplified, and a corresponding voltage level is provided to the input/output circuits.

Figure 2:
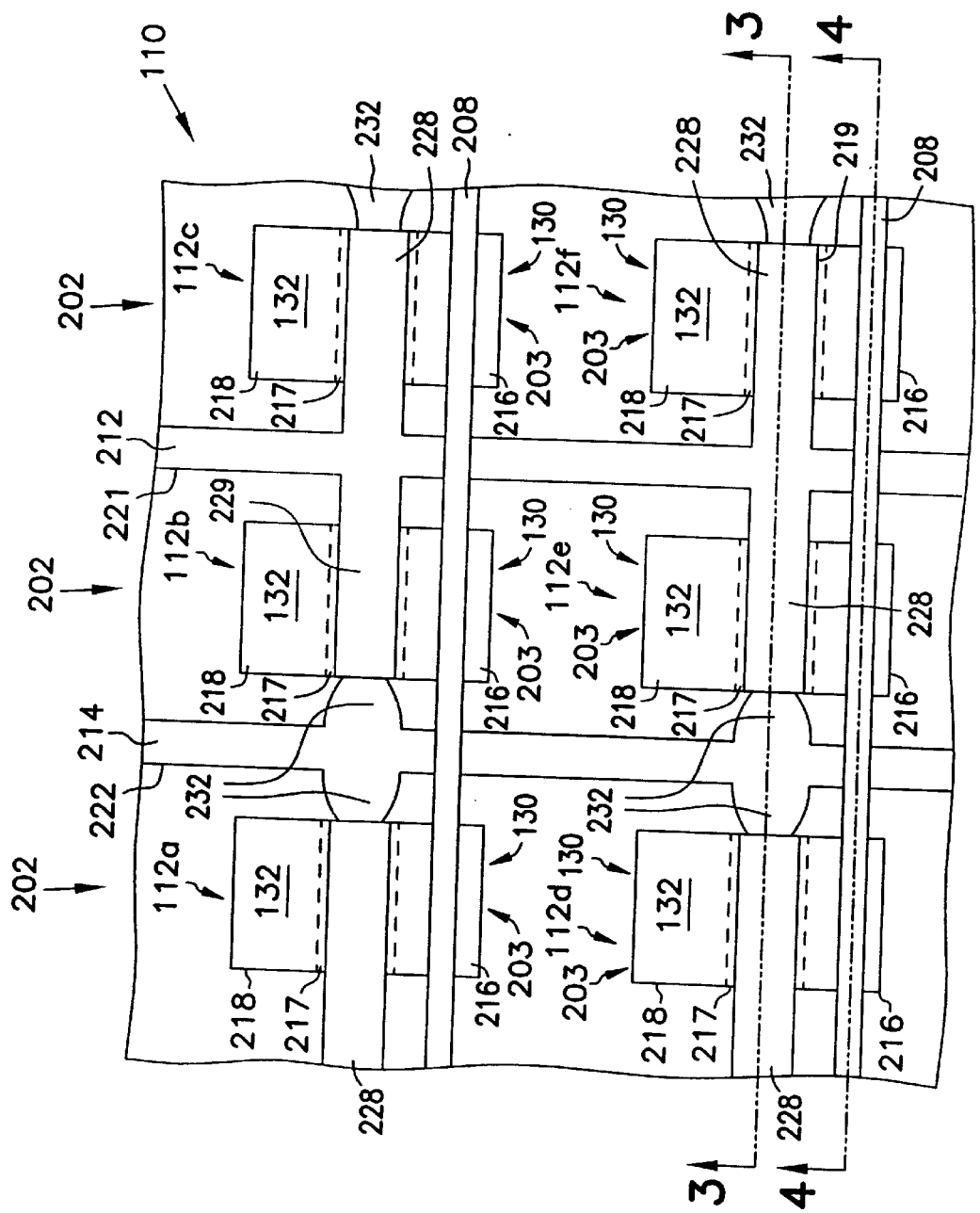
FIG. 2 is a plan view illustrating generally a portion of one embodiment of a memory cell array according to the invention.

FIG. 2 is a plan view illustrating generally a portion of array 110 including the structure of the memory cells 112 according to the invention. Six such memory cells 112, indicated by reference numerals 112a–f, each include an access FET 130 and a storage capacitor 132. As will be described, memory cells 112 are fabricated using semiconductor-on-insulator (SOI) techniques. For example, in one embodiment, a plurality of active semiconductor rows 202 (also interchangeably referred to as "bars") are first formed, such as of a silicon material. Rows 202 are separated from an underlying semiconductor substrate by an insulator, such as silicon dioxide (also referred to as "oxide"). After formation, rows 202 are further processed to define isolated active areas of semiconductor, such as silicon islands 203, which are similarly insulated from the underlying substrate.

Bit lines 208 represent, by way of example, conductive segments of any ones of bit lines BL0–BLn. Word lines 212, which are coupled to gate regions 228 of ones of access FETs 130, represent, by way of example, conductive segments of any ones of word lines WL0–WLm. Body lines 214 represent, by way of example, conductive segments of any one of body lines R0–RM that interconnect body contacts 232 that are coupled to body regions 217 of access FETs 130 in a particular row of memory cells 112. The following detailed description of the structure of memory cells 112 makes reference to only the six memory cells 112a–f, to bit lines 208, word lines 212, and the body lines 214 that are associated with these memory cells 112. However, the following description may be similarly applied to other memory cells 112 and conductive lines in ones of arrays 110.

In the embodiment of FIG. 2, each of memory cells 112a–f includes an access FET 130, having a first n+ source/drain region 216, a p–body region 217 in which a transistor channel region is formed at the surface, and an second n+source/drain region 218. A thin gate oxide region 219 overlies the channel region that is formed on the upper surface of the body region 217 of access FET 130.

Figure 3:
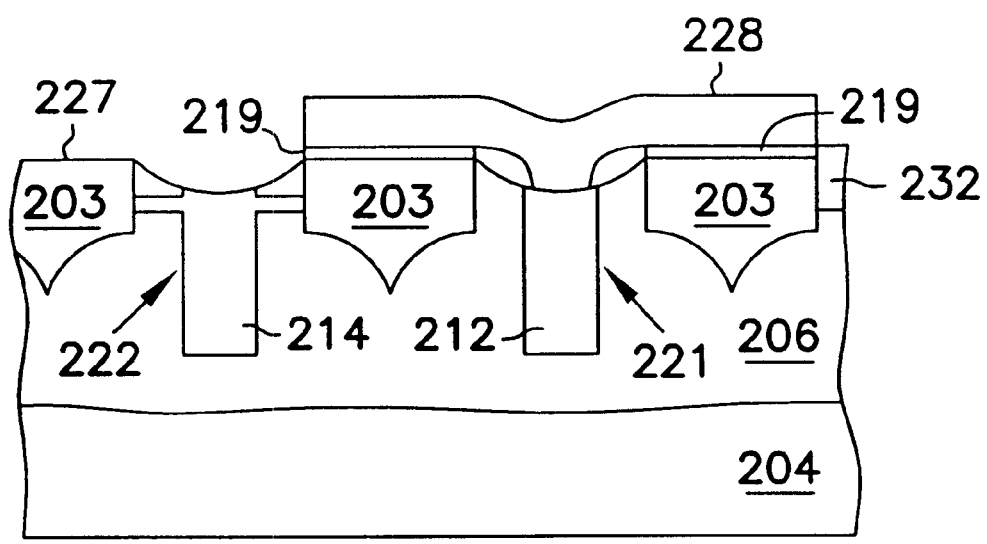
FIG. 3 is a vertical cross-section view taken along the line 3—3 of FIG. 2.
Figure 4:
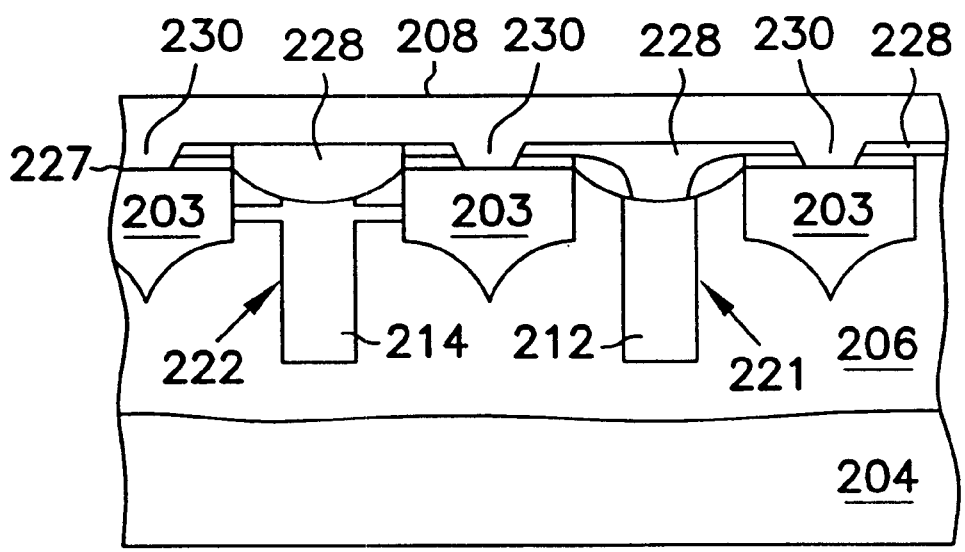
FIG. 4 is a vertical cross-section view taken along the line 4—4 of FIG. 2.

FIGS. 3 and 4 are cross sectional illustrations taken along respective cut lines 3—3 and 4—4 illustrated in FIG. 2. In FIGS. 2–4, word line 212 is disposed in a trench 221 that extends along one side of a row of silicon islands 203. Body line 214 is disposed in a trench 222 that extends, parallel to trench 221, along the opposite side of the row of silicon islands 203. Word lines 212 and body lines 214 are buried below the active semiconductor surface of silicon islands 203 in memory cells 112. Word lines 212 and body lines 214 are buried in an insulating layer such as silicon dioxide (oxide) 206, which electrically isolates adjacent memory cells 112. Each word line 212 is shared by pairs of adjacent memory cells 112, such as memory cell pair 112b and 112c and memory cell pair 112e and 112f. Similarly, each body line 214 is shared by adjacent memory cell pairs, such as memory cell pair 112a and 112b and memory cell pair 112d and 112e.

Word lines 212 can be formed of a refractory metal, such as tungsten or titanium, or of polysilicon, or other suitable material, depending upon the particular fabrication process used. Word lines 212 are coupled to gate regions 228 that extend outward therefrom to overlie the channel regions of access FETs 130 of adjacent memory cells 112, such as memory cells 112e and 112f and memory cells 112b and 112c. Gate regions 228 can be made of polysilicon or other suitable conductive material.

Body lines 214 are coupled to p– body portions 217 of access FETs 130 in memory cells 112 by extending body contact 232 portions. Body contacts 232 extend through portions of oxide 206 along the sidewalls of trenches 222. Body lines 214 can be formed of a refractory metal, such as tungsten or titanium, or of polysilicon, or other suitable conductive material depending on the particular fabrication process used. A body bias voltage signal is applied to a body portions 217 of access FETs 130 in a row of memory cells 112. The body bias voltage is synchronously applied through one of body lines R0–Rm, such as through body line 214, together with a word line activation signal that is applied to one of word lines WL0–WLm, such as to word line 212, for activating access FETs 130 of the same row of memory cells 112.

For example, in a normal standby state, word line 212 is provided approximately 0 Volts. During this same standby state, body line 214 is provided approximately −11.5V to reverse bias the pn junction of the access FET 130, reduce subthreshold leakage currents, and increase data retention time. When the word line activation signal is applied, word line 212 is provided approximately 1.5 Volts and body line 214 is provided approximately 0.5 Volts in order to decrease the turn-on threshold voltage of the access FET 130 and thereby increase the effective gate overdrive voltage provided on the word line 212. Word line 212 controls the gate regions 228 of access FETs 130 on either side of the word line 212. Thus, in one embodiment, adjacent ones of body lines R0-RM on either side of the word line 212 are synchronously activated together with word line 212, as described above, in order to provide body bias voltages to these same access FETs 130.

Figure 5:
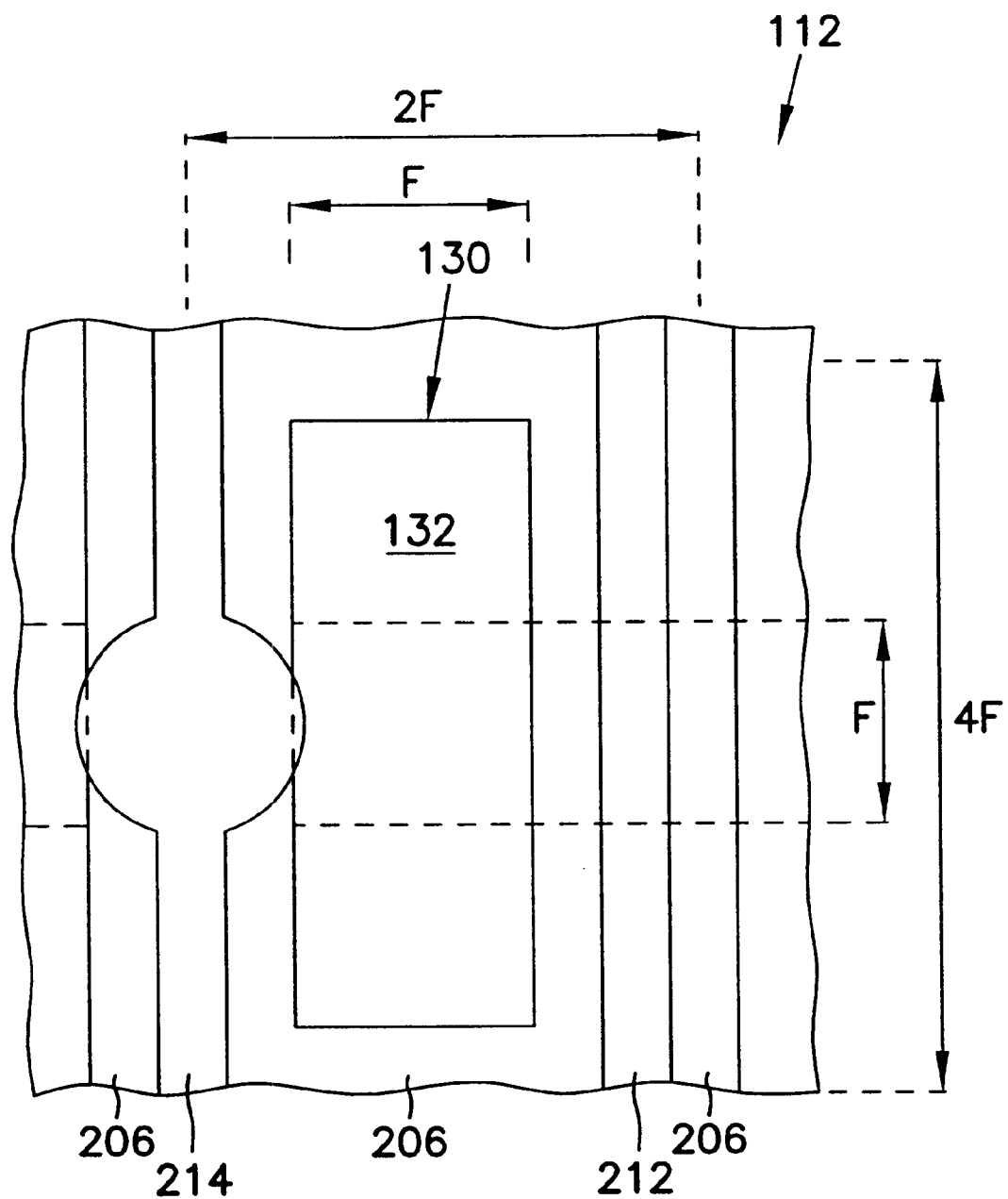
FIG. 5 is an enlarged plan view illustrating generally one embodiment of the invention, including the memory cell and the sidewall contact between the body line and the body region of the access transistor.

Access FETs 130 that are formed on silicon islands 203 function as transfer devices between ones of bit lines BL0–BLn and storage capacitors 132 of corresponding memory cells 112. As illustrated in FIGS. 3 and 4, word lines 212 and body lines 214 are vertically oriented, according to one aspect of the invention. As a result, buried word lines 212 and body lines 214 have a surface line width that is less than minimum lithographic feature size F when viewed from above, as shown in FIG. 2. FIG. 5 is a plan view that illustrates generally the very compact memory cell 112 that results. Because word lines 212 and body lines 214 are shared by adjacent memory cells 112, only one-half the area of each buried word line 212 and each buried body line 214 is allocated to each memory cell 112. Thus, each memory cell 112 has a pitch width of approximately 2 F, measured from the centerline of word line 212 to the centerline of body line 214, and a pitch length of approximately 4 F, where F is the minimum lithographic feature size. F corresponds to the drawn length dimension of access FET 130. Thus, the surface area of each of memory cells 112 is approximately 8 $F^2$.

In one embodiment of the invention, as illustrated in FIG. 4, word line 212 and body line 214 are located at or below the active silicon surface 227 of silicon island 203, but no higher than surface 227. This advantageously provides additional space on the upper portion of memory cells 112 for formation of storage capacitors 132, thus increasing the possible storage capacitance value that is available for a given memory cell 112 surface area. Signal interconnection contacts to word lines 212 and body lines 214 can be made, for example, outside of arrays 110 using conventional etching and contact formation methods.

In FIGS. 2 and 4, bit lines 208 extend orthogonally to word lines 212. Bit lines 208 overlie intersecting portions of word lines 212 and ones of the source/drain regions 216 of the pair of source/drain regions of the access FET 130 in memory cell 112. Bit lines 208 are electrically coupled to ones of the access FET 130 source/drain regions 216 by downwardly extending contact portions 230 of bit lines 208. A storage capacitor 132, such as a stacked capacitor, is formed over the other source/drain region 218 of the pair of source/drain regions of the access FET 130 using any of the many capacitor structures and process sequences known in the art.

Figure 6A:
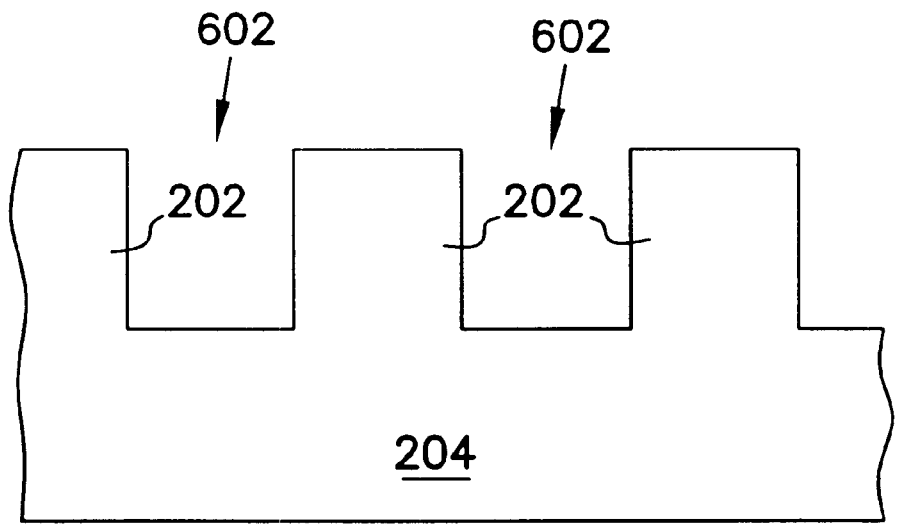
FIGS. 6A–6K illustrate generally process steps for producing a memory cell in accordance with one embodiment of the invention.

FIGS. 6A–K illustrate generally structures resulting from steps in one embodiment of a process of making a memory 100 according to the present invention. In this exemplary embodiment, memory cells 112 are produced using SOI processing techniques. In FIG. 6A, a p– type silicon wafer substrate 204 is used as a starting material. Substrate 204 is processed to form parallel trenches 602, which define bars or rows 202 of semiconductor material from which active areas of silicon islands 203 are formed.

In one embodiment, silicon islands 203 are produced by the method of U.S. patent application Ser. No. 08/706,230 of Leonard Forbes, entitled "Technique For Producing Small Islands of Silicon On Insulator," which is assigned to Micron Technology, Inc., and which disclosure is incorporated herein by reference. Alternatively, silicon islands 203 are formed by the method of U. S. patent application Ser. No. 08/745,708 of Wendell P. Noble, entitled "Technique For Producing Small Islands of Silicon On Insulator," which also is assigned to Micron Technology, Inc. In other embodiments, silicon islands 203 are formed using local oxidation of silicon (LOCOS), separation by implanted oxygen (SIMOX), or other SOI process technology.

More specifically, referring initially to FIGS. 6A–6E, as is more fully described in the referenced application, Serial No. 08706,230, silicon substrate 204 is directionally etched to form trenches 602, leaving rows 202 of silicon protruding upwardly from the substrate 204, such as shown in FIG. 6A. In one embodiment, silicon rows 202 have widths of one micron or less between trenches 602. The depth and width of trenches 602 can be approximately equal to the width of silicon rows 202. To form trenches 602, substrate 204 is oxidized at a temperature of approximately 900 to 1,100 degrees Celsius, covered with silicon nitride ($Si_3N_4$), and masked and etched to form exposed oxide regions using standard techniques. Then, the exposed oxide regions are directionally etched, such as by reactive ion etching (RIE), thereby forming trenches 602 in substrate 204.

Figure 6B:
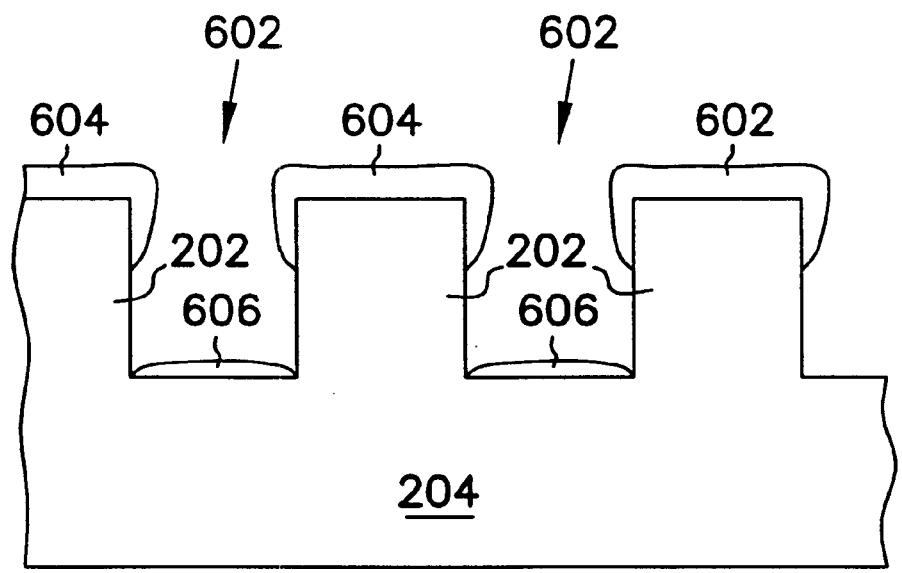

Next, as shown in FIG. 6B, a $Si_3N_4$ cap 604 is formed on the silicon rows 202, such as by chemical vapor deposition (CVD). Cap 604 is formed on rows 202, overhanging partly down the sidewalls of trenches 602. Material overhanging the top of trenches 602 prevents cap 604 from covering the lower portions of the sidewalls of trenches 602. However, during formation of cap 604, some residual $Si_3N_4$ 606 is deposited onto the bottom of trenches 602.

Figure 6C:
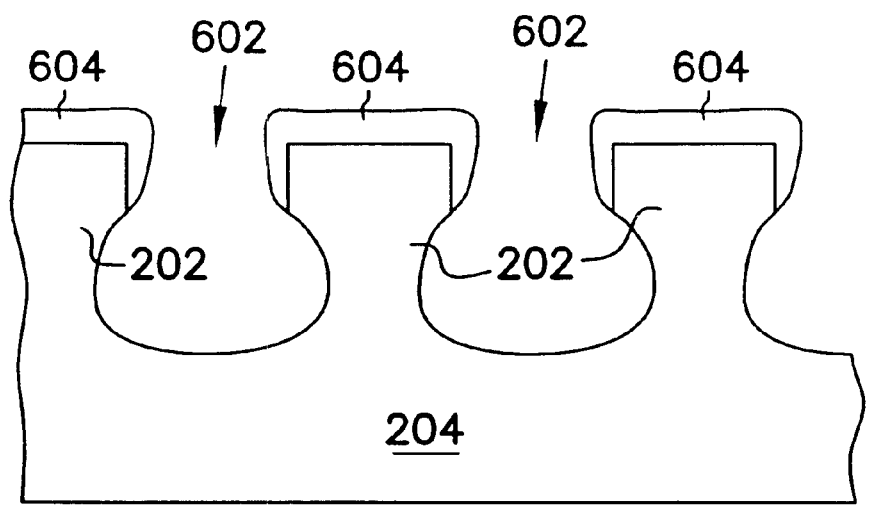
Figure 6D:
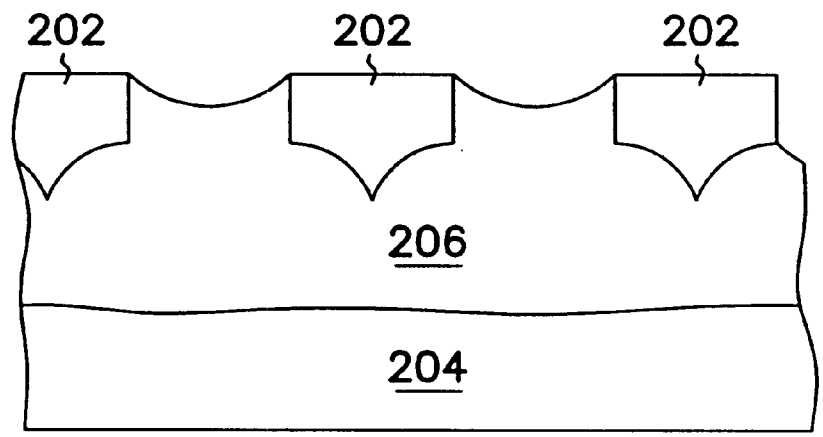

A photoresist mask is used to cover rows 202 during etch removal of residual $Si_3N_4$ 606 on the bottom of trenches 602. An isotropic chemical etch is then used to partially undercut silicon rows 202, as shown in FIG. 6C. A standard chemical etch using hydrofluoric acid (HF) or a commercial etchant sold under the trade name "CP4" (a mixture of approximately 1 part (46% HF):1 part ($CH_3COOH$):3 parts ($HNO_3$)) is one example of such an isotropic etchant that can be used. The volume of silicon removed by this isotropic etch should correspond to a subsequently formed volume of oxide, as described below. In general, the volume of oxide formed is approximately twice that of the silicon consumed. Partially undercutting silicon rows 202 reduces the effective width of rows 202 between trenches 602. The resulting distance is small enough that a relatively short, simple oxidation can fully undercut rows 202. Fully undercutting the rows 202 of silicon during the isotropic etch is also possible because the width of rows 202 is one micron or less.

Substrate 204 is then oxidized using a standard silicon processing furnace at a temperature of approximately 900 to 1,100 degrees Celsius. In the resulting structure, illustrated in FIG. 6D, oxide 206 isolates silicon rows 202 from silicon substrate 204. A wet, oxidizing ambient is used in the furnace chamber to oxidize the exposed silicon regions on the lower sidewall portions of trenches 602 in a direction that is parallel to the surface of substrate 204. Substrate 204 is oxidized for a sufficient time period such that resulting oxide 206 fully undercuts rows 202, thereby isolating rows 202 from substrate 204. Resulting oxide 206 fills the trenches 602 between rows 202. The oxidation time period depends on the initial width of rows 202 and the effective width of rows 202 after the partial undercut step. Narrower rows 202 require less oxidation time. For example, for sub-micron technology, the oxidation time is approximately 3 to 4 hours. For sub-0.25 micron technology, oxidation time is approximately 1 hour.

Silicon islands 203 are then defined in the individual silicon rows 202.

Figure 6E:
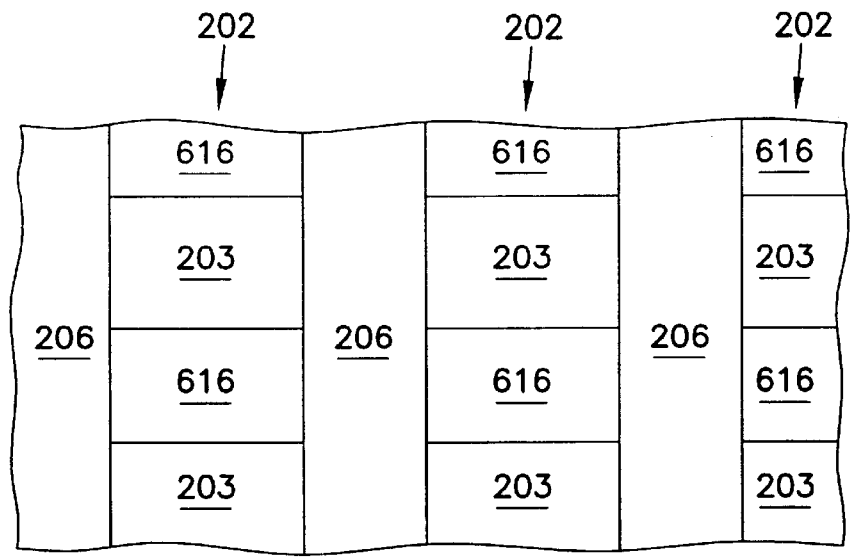
Figure 6F:
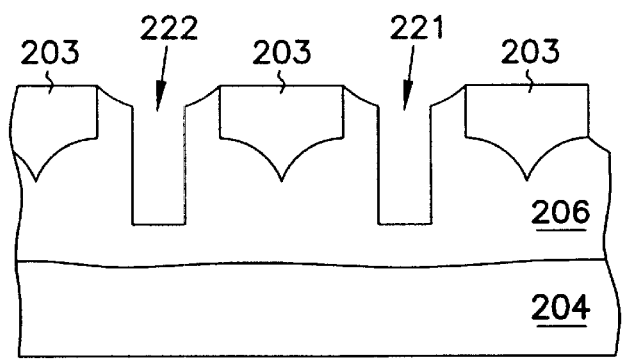

LOCOS or another such process is used to form oxide 616 between active areas of semiconductor islands, such as silicon islands 203 shown in FIG. 6E. Depending on the width of rows 202, the area of the silicon islands 203 is approximately one square micron or less for sub-micron technology and approximately 0.0625 square microns or less for sub-0.25 micron technology. Trenches 221 and 222, in which a respective word line 212 and body line 214 are to be formed, are vertically etched into oxide 206 between rows of silicon islands 203, as shown in FIG. 6F.

In FIGS. 6G–6K, after defining silicon islands 203, access FETs 130 are formed in the silicon islands 203. In one embodiment, standard silicon CMOS integrated circuit process technology is used during these steps to form access FETs 130. In forming access FETs 130, for example, gate oxide 219, gate region 228, body region 217, and source/drain regions 216 and 218 are formed for each access FET 130 on an individual silicon island 203. Then, buried word line 212 and body line 214 are formed in respective trenches 221 and 222.

Figure 6G:
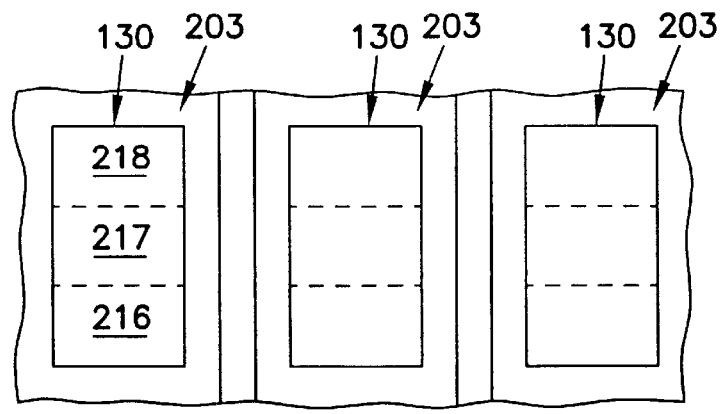
Figure 6H:
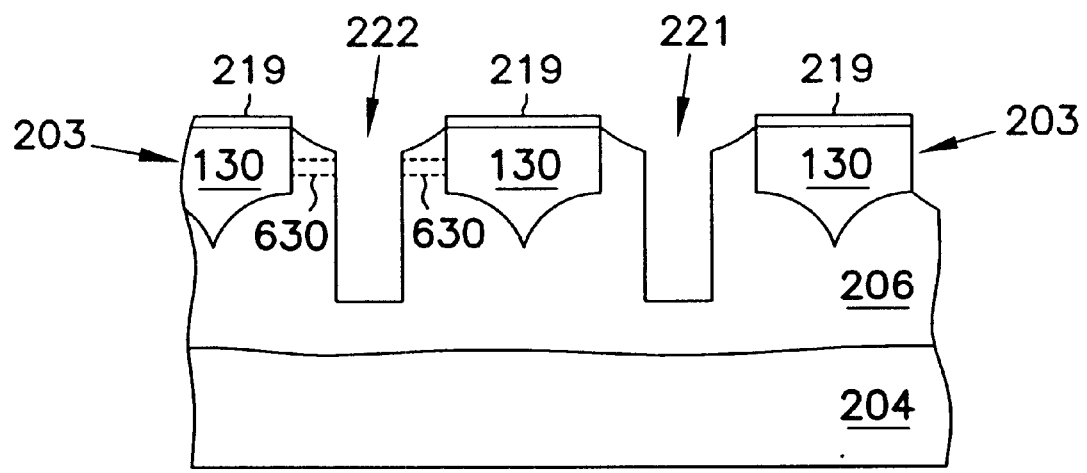

More specifically, in one embodiment illustrated in FIGS. 6G–H, a highquality thin gate oxide 219 is first grown, including over the body region 217. A conductive gate 228, such as polysilicon, is formed on the gate oxide 219, such as by CVD or other technique. Gate 228 is patterned, such as by RIE, and can later be silicided. Source/drain regions 216 and 218 are then formed, such as by a low energy phosphorus or arsenic ion implantation having an approximate range of 30–60 KeV and an approximate dose of slightly over $2*10^{15}$ per $cm^2$. Resulting source/drain regions 216 and 218 are self-aligned to gate 228 of access FET 130.

Body contact openings 630 are formed through portions of oxide 206 along the sidewalls of trench 222 for providing electrical contact between body line 214 and the body region 217 of access FET 130. Forming openings 630 between trench 222 and body region 217 of access FET 130 includes masking, photoresist, and RIE of oxide 206, producing the structure shown in FIG. 6H. A slight overexposure of the photoresist is made during the photolithography to define oversized openings 630. In addition, a slight RIE over etching of oxide 206 on the sidewalls of trenches 222 ensures good sidewall contacts to p– body regions 217 of access FETs 130. These over-etching and over-exposure steps enhance manufacturing yield and can be employed with contacts of either polysilicon, refractory metal, or any other suitable materials.

Next, conductive word lines 212 and body lines 214 are formed, such as by CVD depositing a refractory metal (e.g., tungsten) or other suitable material in respective trenches 221 and 222. Body contact 232 portions of the conductive material deposited in trench 222 substantially fills openings 630, providing electrical continuity between body line 214 and the p– body region 217 of access FET 130, producing the structure shown in FIG. 6I.

Figure 6I:
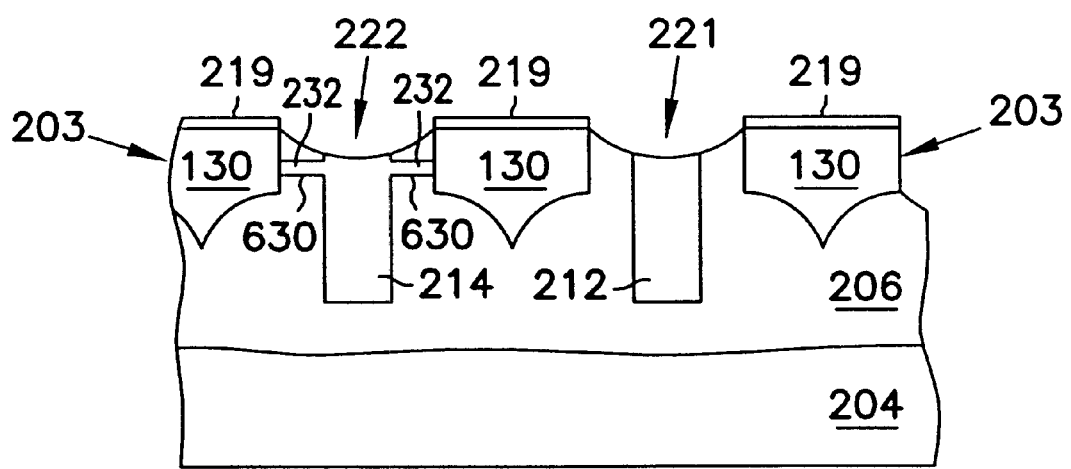
Figure 6J:
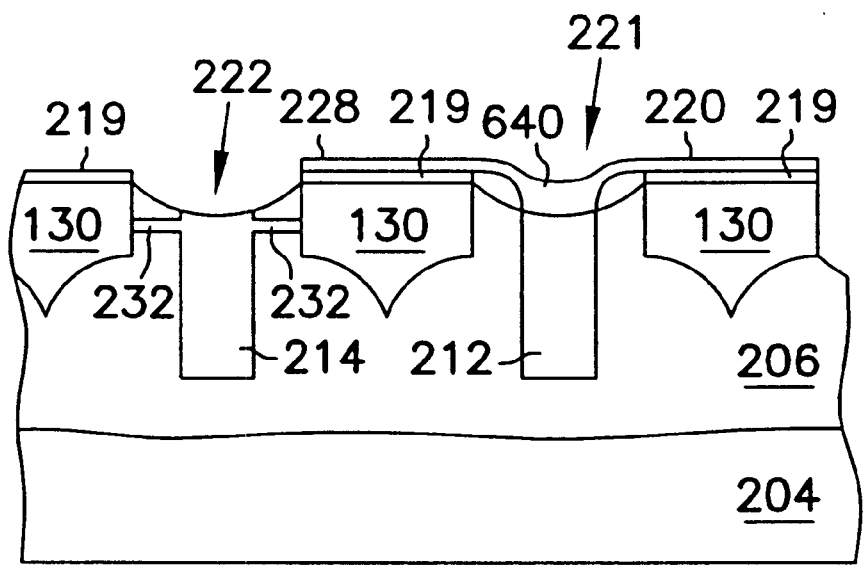
Figure 6K:
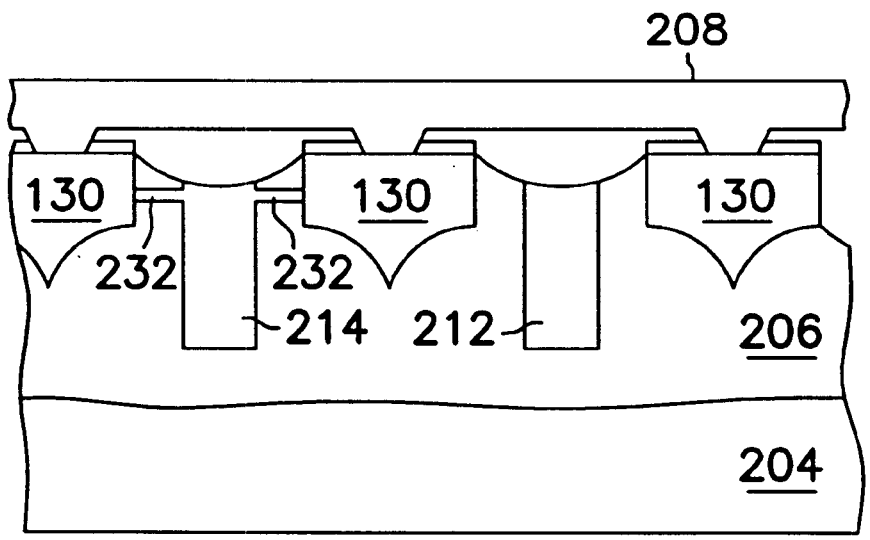

Word line contacts 640 are then formed, such as by depositing and patterning metal or other conductive material between word line 212 and gate 228, providing the structure as shown in FIG. 6J. FIG. 6J and FIG. 3 are taken along the same cut line 3—3 of FIG. 2. Bit lines 208 can be formed together with the word line contacts 640, in which case the resultant structure is shown in FIG. 6K. FIGS. 6K and 4 are taken along the same cut line 4—4 of FIG. 2. Bit lines 208 are formed to contact a source/drain region 216 of a pair of source/drain regions associated with an access FET 130.

The remainder of the structure of memory cell 112 thus formed is then processed to fabricate a storage capacitor 132 on the upper surface of each memory cell 112. For example, known stacked capacitor fabrication techniques can be used, followed by conventional back end of line (BEOL) process procedures.

Figure 7A:
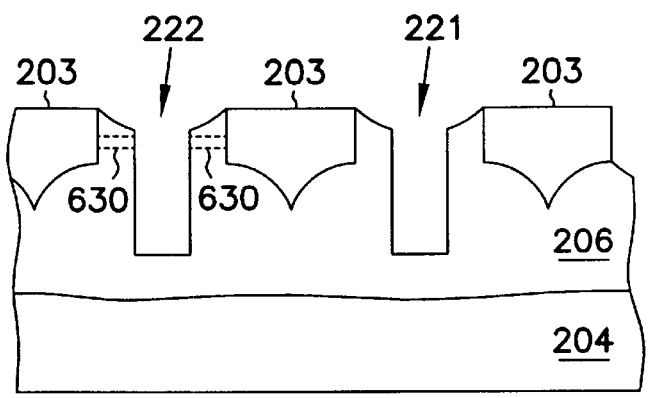
FIGS. 7A–7C illustrate generally process steps for producing a memory cell in accordance with another embodiment of the invention.
Figure 7B:
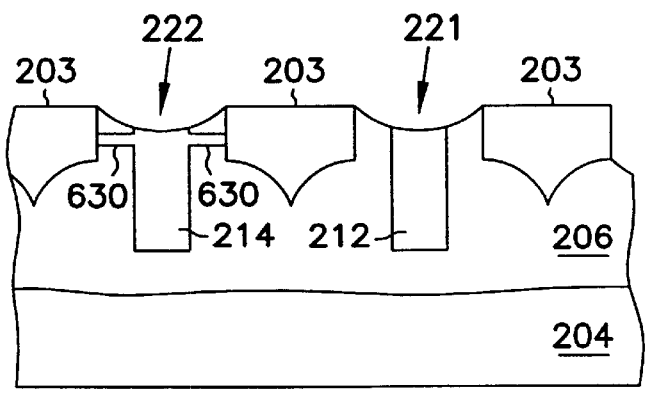
Figure 7C:
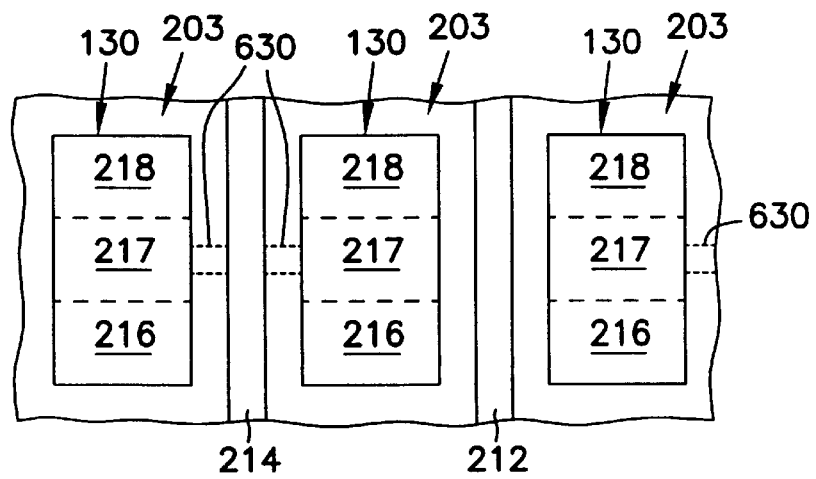

FIGS. 7A–C illustrate generally another embodiment of a method of fabricating memory cell 112 according to the present invention. In this embodiment, word line 212 and body line 214 are formed in respective trenches 221 and 222 prior to forming access FETs 130 in silicon islands 203. First, silicon islands 203 are formed, with isolation trenches 221 and 222 between rows 202 of silicon islands 203, using the process described above with respect to FIGS. 6A–6F. Body contact openings 630 are then formed, as shown in FIG. 7A, through oxide 206 to the portion of silicon island 203 from which the p– body region 217 of the access FET 130 is formed during subsequent process steps.

In one embodiment of FIGS. 7A–C, word line 212 and body line 214 are polysilicon or other suitable conductor formed by low pressure chemical vapor deposition (LPCVD), or other suitable process, then patterned by RIE. For example, an n+ polysilicon or other suitable conductor is deposited by CVD to a thickness of 50 nm to form word line 212 and body line 214 as shown in FIG. 7B. Word line 212 and body line 214 can be formed together in the same step in respective trenches 221 and 222, on both sides of a row 202 of silicon islands 203. Word lines 212 and body lines 214 can include suicides, such as tungsten silicide formed by CVD. Sidewall body contacts 232 in openings 630 are formed together with body lines 214 for contacting the body regions 217 of the access FETs 130 in silicon islands 203. Excess material used in forming word lines 212 and body lines 214 can be removed, such as by chemical mechanical polishing (CMP) or other suitable method.

Thereafter, access FETs 130 are formed in substantially the same manner described above with respect to FIGS. 6D–E, providing the structure shown in FIG. 7C. Subsequent memory cell 112 processing includes forming the word line contacts 640 as described with respect to FIG. 6J, and producing conductive bit lines 208, as described above with respect to FIG. 6K. Subsequent processing further includes fabricating a storage capacitor 132 on the upper surface of the memory cell 112, using known techniques, followed by conventional back end of line (BEOL) process procedures.

Thus, the present invention provides arrays of memory cells using SOI techniques in which word lines and body lines are buried in trenches formed on opposite sides of rows of active semiconductor material. Each memory cell includes an access FET coupled to a storage capacitor. Word lines and body lines are formed having less than a minimum lithographic feature size F when viewed from the upper surface of the memory cell. As a result, the memory cell structure has a surface area of approximately $8F^2$. Contact between the body regions of the access FETs and interconnecting body lines is provided through openings in oxide sidewalls of the trenches. This reduces the surface area required by the memory cell.

What is claimed is:

1. A method of fabricating a memory array on a semiconductor substrate, comprising:

defining a bar of semiconductor material in the substrate;

forming an insulating layer between the bar and the substrate for providing electrical isolation therebetween;

defining a plurality of active areas of semiconductor material on the bar;

producing an access transistor in each of the active areas, each access transistor including gate, body, and first and second source/drain regions;

forming a word line trench and a word line in the word line trench;

coupling the word line to the gate region of at least one of the access transistors;

forming a body line trench and a body line in the body line trench; and electrically connecting the body line to the body region of at least one of the access transistors.

2. The method of claim 1, wherein forming the insulating layer between the bar and the substrate includes partially undercutting the bar using an isotropic etch and oxidizing to fully isolate the bottom of the bar from the substrate.

3. The method of claim 1, wherein defining the active areas includes forming oxide between portions of the semiconductor material that forms the bar.

4. The method of claim 1, including forming the word and body lines prior to producing the access transistors.

5. The method of claim 1, including producing the access transistors prior to forming the word and body lines.

6. The method of claim 1, including forming the word line and the body contact line to be located at a height that is no higher than an upper surface of the access transistors.

7. The method of claim 1, including electrically coupling the word line to the gate regions of a plurality of the access transistors, and electrically coupling the body line to the body regions of a plurality of the access transistors.

8. The method of claim 1, including:

interposing an insulating layer between the body line and the second trench;

forming a plurality of contact openings through the insulating layer between the body line and the body regions of the access transistors; and forming contacts in the contact openings for electrically coupling the body line and the body regions of the access transistors.

9. The method of claim 8, wherein forming the contact openings includes:

defining, by photoresist, regions in the insulating layer in the second trench in which the contact openings are to be formed; and etching the contact openings using a reactive ion etch (RIE) process.

10. The method of claim 9, further including overexposing the photoresist material and over etching the contact openings to define oversized contact openings.

11. A method for fabricating a memory array on a semiconductor substrate, comprising:

defining at least first, second and third bars of semiconductor material in the substrate;

forming an insulating layer between the bars and the substrate for providing electrical isolation therebetween;

defining a plurality of semiconductor active areas on each of the bars;

producing an access transistor in each of the active areas, each access transistor including gate, body, and first and second source/drain regions;

forming a first word line trench and a word line in the first word line trench;

coupling the word line to the gate region of a plurality of the access transistors on the first and second bars;

forming a first body line trench and a body line in the first body line trench; and electrically coupling the body line to the body region of a plurality of the access transistors on the second and third bars.

12. A method of fabricating a memory array on a semiconductor substrate, comprising:

forming at least first and second trenches in the substrate to define a bar of semiconductor material;

forming an insulating layer between the bar and the substrate for providing electrical isolation therebetween, including:

partially undercutting the bar using an isotropic etch; and oxidizing to fully isolate the bottom of the bar from the substrate;

defining a plurality of active areas of semiconductor material on the bar, including forming oxide between portions of the semiconductor material that forms the bar;

producing an access transistor in each of the active areas, each access transistor including gate, body, and first and second source/drain regions;

forming a buried word line;

coupling the word line to the gate region of at least one of the access transistors;

forming a buried body line; and electrically connecting the body line to the body region of at least one of the access transistors.

13. The method of claim 12, wherein forming a buried word line and forming a buried body line are performed prior to producing an access transistor.

14. The method of claim 12, wherein producing an access transistor is performed prior to forming a buried word line and forming a buried body line.

15. The method of claim 12, further including fabricating a storage capacitor over each of the active areas, wherein the capacitor is operably connected to the access transistor.

16. A method of fabricating a memory array on a semiconductor substrate, comprising:

forming at least first and second trenches in the substrate to define a bar of semiconductor material;

forming an insulating layer between the bar and the substrate for providing electrical isolation therebetween;

defining a plurality of active areas of semiconductor material on the bar;

producing an access transistor in each of the active areas, each access transistor including gate, body, and first and second source/drain regions, each access transistor having an upper surface;

forming a buried word line at a height that is no higher than the upper surface of the access transistors;

forming a buried body line at a height that is no higher than the upper surface of the access transistors;

electrically coupling the buried word line to the gate regions of a plurality of the access transistors; and electrically coupling the buried body line to the body regions of a plurality of the access transistors.

17. The method of claim 16, wherein forming a buried word line and forming a buried body line are performed prior to producing an access transistor.

18. The method of claim 16, wherein producing an access transistor is performed prior to forming a buried word line and forming a buried body line.

19. The method of claim 16, further including fabricating a storage capacitor over each of the active areas, wherein the capacitor is operably connected to the access transistor.

20. A method of fabricating a memory array on a semiconductor substrate, comprising:

forming at least first and second trenches in the substrate to define a bar of semiconductor material;

forming an insulating layer between the bar and the substrate for providing electrical isolation therebetween;

defining a plurality of active areas of semiconductor material on the bar;

producing an access transistor in each of the active areas, each access transistor including gate, body, and first and second source/drain regions;

forming a buried word line;

coupling the word line to the gate region of at least one of the access transistors;

forming a buried body line;

electrically connecting the body line to the body region of at least one of the access transistors;

forming a plurality of contact openings through an insulating layer between the buried body line and the body regions of the access transistors; and forming contacts in the contact openings for electrically coupling the buried body line and the body regions of the access transistors.

21. The method of claim 20, wherein forming a buried word line and forming a buried body line are performed prior to producing an access transistor.

22. The method of claim 20, wherein producing an access transistor is performed prior to forming a buried word line and forming a buried body line.

23. The method of claim 20, wherein forming the contact openings includes:

defining regions in the insulating layer in the second trench in which the contact openings are to be formed; and etching the contact openings using a reactive ion etch (RIE) process.

24. The method of claim 23, further including overexposing a photoresist material and over etching the contact openings to define oversized contact openings.

25. The method of claim 20, further including fabricating a storage capacitor over each of the active areas, wherein the capacitor is operably connected to the access transistor.

26. A method for fabricating a memory array, comprising:

isolating a row of semiconductor material from a substrate;

defining a plurality of islands in the row;

forming a transistor on each of the islands, wherein each transistor includes a gate region, a body region, and two source/drain regions;

forming a body line trench and a body line in each body line trench, wherein the body line is in electrical contact with the body regions through a body contact opening extending from the body line trench to the body regions of the transistors;

forming a word line trench and a word line in each word line trench, wherein the word line is in electrical contract with the gate regions of the transistors;

forming bit lines to contact one of the source/drain regions of the transistors; and forming a capacitor over the islands, wherein the capacitor is electrically connected to the other one of the source/drain regions of the transistors.

27. The method of claim 26, wherein isolating the row from the substrate comprises:

undercutting the row using an etching process; and oxidizing the substrate to isolate the rows from the substrate.

28. The method of claim 26, wherein isolating the row from the substrate further comprises:

forming a cap on the row;

undercutting the row using an etching process; and providing an oxide between the row and the substrate.

29. The method of claim 28, wherein undercutting the row includes partially undercutting the row using an etching process.

30. The method of claim 28, wherein providing an oxide between the row and the substrate includes oxidizing the substrate.

31. The method of claim 26, wherein defining a plurality of islands in the row comprises forming oxide areas between active areas of islands.

32. A method for fabricating a memory array, comprising:

forming at least one row of active islands insulated from an underlying semiconductor substrate using a semiconductor-on-insulator technique;

forming a transistor on each of at least one of the active islands;

forming a body line trench on a first side of the at least one row of active islands;

forming a word line trench on a second side of the at least one row of active islands;

forming a body line in the body line trench;

forming a word line in the word line trench; and operably connecting the body line and the word line to the transistor.

33. The method of claim 32, wherein forming a word line and forming a body line are performed prior to forming a transistor.

34. The method of claim 32, wherein forming a transistor is performed prior to forming a word line and forming a body line.

35. The method of claim 32, further comprising:

forming a bit line operably connected to the transistor; and forming a capacitor over the active island, wherein the capacitor is operably connected to the transistor.

* * * * *

UNITED STATES PATENT AND TRADEMARK OFFICE
CERTIFICATE OF CORRECTION

PATENT NO. : 6,465,298 B2
DATED : October 15, 2002
INVENTOR(S) : Leonard Forbes and Kie Y. Ahn It is certified that error appears in the above-identified patent and that said Letters Patent is hereby corrected as shown below:

<u>Title page,</u>
Item [56], U.S. PATENT DOCUMENTS, insert the following:

```
-- 4,252,579   02/24/1981   Ho, I.T., et al.          148   174      05/07/79
   4,929,988   05/29/1990   Yoshikawa, K.             357   23.5     08/23/88
   5,379,255   01/03/1995   Shah, P.L.                365   185      12/14/92
   5,382,540   01/17/1995   Sharma, U., et al.        437   52       09/20/93
   5,612,559   03/18/1997   Park, K., et al.          257   302      08/30/94
   5,874,760   02/23/1999   Burns, Jr., S.M., et al.  257   315      01/22/97
   5,943,267   08/24/1999   Sekariapuram, S., et al.  365   185.28   06/12/98
   5,981,995   11/09/1999   Selcuk, A.A.              257   330      06/13/97
   6,040,210   03/21/2000   Burns, Jr., S.M., et al.  438   238      01/26/98
   6,172,391   01/09/2001   Goebel, B.                257   305      08/27/98
   6,221,788   04/24/2001   Kobayashi, H., et al.     438   762      12/18/98
   6,255,708   07/03/2001   Sudharsanan, R., et al.   257   428      10/10/97 --
```

U.S. PATENT DOCUMENTS,
Delete "Jr." after "Pfiester".
Delete "et al." after "Harari".
Delete "Sung" and insert -- Sung-Mu --, therefor.
Delete "et al." after "Ozaki".
Delete "Merrit" and insert -- Merritt --, therefor.
Delete "257/596" and insert -- 257/296 --, therefor.

FOREIGN PATENT DOCUMENTS, insert the following:

```
-- JP   11-135757    05/1999   H01L   27/108
   JP   2000-164883  06/2000   H01L   29/786 --
```

UNITED STATES PATENT AND TRADEMARK OFFICE
CERTIFICATE OF CORRECTION

PATENT NO. : 6,465,298 B2
DATED : October 15, 2002
INVENTOR(S) : Leonard Forbes and Kie Y. Ahn It is certified that error appears in the above-identified patent and that said Letters Patent is hereby corrected as shown below:

Column 1,
Line 12, delete "(DAM)" and insert -- (DRAM) --, therefor.
Line 18, delete "tacked" and insert -- stacked --, therefor.

Column 2,
Line 34, insert -- . -- after "area".
Line 57, insert -- a -- before "body region".

Column 7,
Line 17, delete "RO-RM" and insert -- R0-Rm --, therefor.

Column 8,
Line 14, insert -- , -- after "application".

Column 10,
Line 3, delete "FIG. 61" and insert -- FIG. 6I -- therefor.
Line 43, delete "suicides" and insert -- silicides -- therefor.

Signed and Sealed this

Twenty-second Day of April, 2003

JAMES E. ROGAN
*Director of the United States Patent and Trademark Office*